(12) United States Patent
Dubash et al.

(10) Patent No.: US 7,616,064 B2
(45) Date of Patent: Nov. 10, 2009

(54) DIGITAL SYNTHESIZER FOR LOW POWER LOCATION RECEIVERS

(76) Inventors: Noshir Dubash, 1527 E. Monterey St., Chandler, AZ (US) 85225; Jeff Ogren, 381 S. Forest Dr., Chandler, AZ (US) 85228; Raja Tupelly, 4901 S. Calle Los Cerros Dr., Unit #151, Tempe, AZ (US) 85282; Jeffrey E. Koeller, 6111 E. Riverdale St., Mesa, AZ (US) 85215; Doug Schucker, 501 E. Rawhide Ave., Gilbert, AZ (US) 85296

( * ) Notice: Subject to any disclaimer, the term of this patent is extended or adjusted under 35 U.S.C. 154(b) by 59 days.

(21) Appl. No.: 12/039,671

(22) Filed: Feb. 28, 2008

(65) Prior Publication Data

US 2009/0219099 A1 Sep. 3, 2009

(51) Int. Cl.
*H03L 7/06* (2006.01)
*H03L 7/16* (2006.01)
*H03L 7/18* (2006.01)

(52) U.S. Cl. .......................................... 331/1 A; 331/16
(58) Field of Classification Search ................. 331/1 A, 331/8, 16–18, 25; 327/156–159; 332/127; 360/51; 375/376; 455/260
See application file for complete search history.

(56) References Cited

U.S. PATENT DOCUMENTS

| 5,663,734 | A | 9/1997 | Krasner |
|---|---|---|---|
| 5,663,735 | A | 9/1997 | Eshenbach |
| 5,781,156 | A | 7/1998 | Krasner |
| 5,812,087 | A | 9/1998 | Krasner |
| 5,825,327 | A | 10/1998 | Krasner |
| 5,831,574 | A | 11/1998 | Krasner |
| 5,841,396 | A | 11/1998 | Krasner |
| 5,874,914 | A | 2/1999 | Krasner |
| 5,884,214 | A | 3/1999 | Krasner |
| 5,945,944 | A | 8/1999 | Krasner |
| 5,999,124 | A | 12/1999 | Sheynblat |
| 6,002,363 | A | 12/1999 | Krasner |
| 6,016,119 | A | 1/2000 | Krasner |
| 6,052,081 | A | 4/2000 | Krasner |
| 6,061,018 | A | 5/2000 | Sheynblat |
| 6,064,336 | A | 5/2000 | Krasner |
| 6,104,338 | A | 8/2000 | Krasner |
| 6,104,340 | A | 8/2000 | Krasner |
| 6,107,960 | A | 8/2000 | Krasner |
| 6,111,540 | A | 8/2000 | Krasner |
| 6,131,067 | A | 10/2000 | Girerd |
| 6,133,871 | A | 10/2000 | Krasner |
| 6,133,873 | A | 10/2000 | Krasner |
| 6,133,874 | A | 10/2000 | Krasner |
| 6,150,980 | A | 11/2000 | Krasner |
| 6,185,427 | B1 | 2/2001 | Krasner |
| 6,208,290 | B1 | 3/2001 | Krasner |
| 6,208,291 | B1 | 3/2001 | Krasner |
| 6,215,441 | B1 | 4/2001 | Moeglein |
| 6,215,442 | B1 | 4/2001 | Sheynblat |
| 6,236,354 | B1 | 5/2001 | Krasner |
| 6,239,742 | B1 | 5/2001 | Krasner |
| 6,259,399 | B1 | 7/2001 | Krasner |
| 6,272,430 | B1 | 8/2001 | Krasner |
| 6,289,041 | B1 | 9/2001 | Krasner |
| 6,307,504 | B1 | 10/2001 | Sheynblat |

(Continued)

*Primary Examiner*—David Mis

(57) ABSTRACT

A high-frequency phase locked loop synthesizer having a selectable fractional-N divider and integer divider along with a phase frequency detector implemented as a CMOS logic block.

24 Claims, 5 Drawing Sheets

U.S. PATENT DOCUMENTS

| | | | |
|---|---|---|---|
| 6,313,786 B1 | 11/2001 | Sheynblat |
| 6,314,308 B1 | 11/2001 | Sheynblat |
| 6,377,209 B1 | 4/2002 | Krasner |
| 6,408,196 B2 | 6/2002 | Sheynblat |
| 6,411,254 B1 | 6/2002 | Moeglein |
| 6,411,892 B1 | 6/2002 | Van Diggelen |
| 6,417,801 B1 | 7/2002 | Van Diggelen |
| 6,421,002 B2 | 7/2002 | Krasner |
| 6,429,814 B1 | 8/2002 | Van Diggelen et al. |
| 6,433,731 B1 | 8/2002 | Sheynblat |
| 6,453,237 B1 | 9/2002 | Fuchs et al. |
| 6,484,097 B2 | 11/2002 | Fuchs et al. |
| 6,487,499 B1 | 11/2002 | Fuchs et al. |
| 6,510,387 B2 | 1/2003 | Fuchs et al. |
| 6,542,821 B2 | 4/2003 | Krasner |
| 6,583,757 B2 | 6/2003 | Krasner |
| 6,597,311 B2 | 7/2003 | Sheynblat |
| 2002/0163389 A1* | 11/2002 | Jun .......................... 331/1 A |

\* cited by examiner

DIGITAL SYNTHESIZER FOR LOW POWER LOCATION RECEIVERS

BACKGROUND OF THE INVENTION

1. Field of the Invention

This invention relates generally to location receivers and more particularly to phase locked loop (PLL) synthesizer employed in location receivers.

2. Related Art

A Global Navigation Satellite System (GNSS), such as a GPS, Galileo, or GLONAV satellite system is based on radio navigation. The GPS system is a satellite based navigation system having a network of 24 satellites, plus on orbit spares, orbiting 11,000 nautical miles above the Earth, in six evenly distributed orbits. Each GPS satellite orbits the Earth every twelve hours.

A prime function of the GPS satellites is to serve as a clock. Each GPS satellite derives its signals from an on board 10.23 MHz Cesium atomic clock. Each GPS satellite transmits a spread spectrum signal with its own individual pseudo noise (PN) code. By transmitting several signals over the same spectrum using distinctly different PN coding sequences the GPS satellites may share the same bandwidth without interfering with each other. The code used in the GPS system is 1023 bits long and is sent at a rate of 1.023 megabits per second, yielding a time mark, sometimes called a "chip" approximately once every micro-second. The sequence repeats once every millisecond and is called the coarse acquisition code (C/A code). Every 20th cycle the code can change phase and is used to encode a 1500 bit long message, which contains "almanac" data for the other GPS satellites.

There are 32 PN codes designated by the GPS authority. Twenty-four of the PN codes belong to current GPS satellites in orbit and the 25th PN code is designated as not being assigned to any GPS satellite. The remaining PN codes are spare codes that may be used in new GPS satellites to replace old or failing units. A location receiver, such as a GPS receiver, may use the different PN sequences to search a received signal spectrum looking for a match. If the location receiver finds a match, then it has identified the GPS satellite, which generated that signal.

Location receivers typically use a variant of radio range measurement methodology, called trilateration, in order to determine the position of the ground based location receiver. The position determination employed by a location receiver is different from the radio direction finding (RDF) technology of the past in that the radio beacons are no longer stationary; they are satellites moving through space at a speed of about 1.8 miles per second as they orbit the earth. By being space based, the GPS system can be used to establish the position of virtually any point on Earth using methods such as trilateration.

The trilateration method depends on the location receiving unit obtaining a time signal from the GPS satellites. By knowing the actual time and comparing it to the time that is received from the GPS satellites, the location receiver can calculate the distance to the GPS satellite. If, for example, the GPS satellite is 12,000 miles from the location receiver, then the location receiver must be located somewhere on the location sphere defined by the radius of 12,000 miles from that GPS satellite. If the location receiver then ascertains the position of a second GPS satellite it can calculate the receiver's location based on a location sphere around the second GPS satellite. The two spheres intersect and form a circle with the location receiver being located somewhere within that location circle. By ascertaining the distance to a third GPS satellite the location receiver can project a location sphere around the third GPS satellite. The third GPS satellite's location sphere will then intersect the location circle produced by the intersection of the location spheres of the first two GPS satellites at just two points. By determining the location sphere of one more GPS satellite, whose location sphere will intersect one of the two possible location points; the precise position of the location receiver is determined to be the location point located on the Earth. The fourth GPS satellite is also used to resolve the clock error in the receiver. As a consequence, the exact time may also be determined, because there is only one time offset that can account for the positions of all the GPS satellites. The trilateration method may yield positional accuracy on the order of 30 meters; however the accuracy of GPS position determination may be degraded due to signal strength and multipath reflections.

As many as 11 GPS satellites may be received by a location receiver at one time. In certain environments such as a canyon, some GPS satellites may be blocked out, and the GPS position determining system may depend for position information on GPS satellites that have weaker signal strengths, such as GPS satellites near the horizon. In other cases overhead foliage may reduce the signal strength that is received by the location receiver unit. In either case the signal strength may be reduced or totally blocked. In such case, aiding information may be used to aid in location determination.

There are multiple ways of using radio spectrum to communicate. For example in frequency division multiple access (FDMA) systems, the frequency band is divided into a series of frequency slots and different transmitters are allotted different frequency slots. In time division multiple access (TDMA) systems, the time that each transmitter may broadcast is limited to a time slot, such that transmitters transmit their messages one after another, only transmitting during their allotted period. With TDMA, the frequency upon which each transmitter transmits may be a constant frequency or may be continuously changing (frequency hopping).

As previously mentioned, another way of allotting the radio spectrum to multiple users is through the use of code division multiple access (CDMA) also known as spread spectrum. In CDMA all the users transmit on the same frequency band all of the time. Each user has a dedicated code that is used to separate that user's transmission from all others. This code is commonly referred to as a spreading code, because it spreads the information across the band. The code is also commonly referred to as a Pseudo Noise or PN code. In a CDMA transmission, each bit of transmitted data is replaced by that particular user's spreading code if the data to be transmitted is a "1", and is replaced by the inverse of the spreading, code if the data to be transmitted is "0".

To decode the transmission at the receiver unit it is necessary to "despread" the code. The despreading process takes the incoming signal and multiplies it by the spreading code chip by chip and sums the result. This process is commonly known as correlation, and it is commonly said that the signal is correlated with the PN code. The result of the despreading process is that the original data may be separated from all the other transmissions, and the original signal may be recovered. A property of the PN codes that are used in CDMA systems is that the presence of one spread spectrum code does not change the result of the decoding of another code. The property that one code does not interfere with the presence of another code is often referred to as orthogonality, and codes, which have this property, are said to be orthogonal. The process of extracting data from a spread spectrum signal is commonly known by many terms such as correlating, decoding, and despreading. Those terms may be used interchangeably herein. The codes used by a spread spectrum system are commonly referred to by a variety of terms including, but not limited to, PN (Pseudo Noise) codes, PRC (Pseudo Random Codes), spreading code, despreading code, and orthogonal code. Those terms may also be used interchangeably herein.

It is because CDMA spreads the data across a broadcast spectrum larger than strictly necessary to transmit data that CDMA is often referred to as spread spectrum. Spread spectrum has a number of benefits. One benefit being that because the data transmitted is spread across the spectrum, spread spectrum can tolerate interference better than some other protocols. Another benefit is that messages can be transmitted with low power and still be decoded, and yet another benefit is that several signals can be received simultaneously with one receiver tuned on the same frequency.

The GPS system uses spread spectrum technology to convey its data to ground units. The use of spread spectrum is especially advantageous in satellite positioning systems. Spread spectrum technology enables location receiver units to operate on a single frequency, thus saving the additional electronics that would be needed to switch and tune other bands if multiple frequencies were used. Spread Spectrum also minimizes power consumption requirements of location receivers. GPS transmitters for example require 50 watts or less and tolerate substantial interference.

The location receivers are generally composed of a radio frequency (RF) front end portion and a baseband portion that are formed using integrated circuits. These integrated circuits are implemented in bipolar, BiCMOS, or CMOS process technology. The Front-end portion of a typical location receiver downconverts the GPS RF input signal to a lower intermediated frequency (IF) signal, by mixing the GPS RF with an RF local oscillator (LO) signal which is relatively close in frequency to the GPS RF frequency. Typically the front end also includes a phase locked loop (PLL) synthesizer for locking the LO frequency to a reference frequency. The RF/analog PLL does not match to the phase of the incoming signal; the incoming GPS signal is buried in noise and it is only after the correlation/despreading process in the baseband that the signal phase may be recovered. Matching to the PRN code phase is done digitally in the baseband portion. The PLL synthesizer also provides the clock for the analog-to-digital converter (ADC) which digitizes the downconverted IF signal. The PLL synthesizer may be made up of components that include a fractional-N divider, integer divider, and phase frequency detector (PFD). The logical functions in the dividers and PFD are typically implemented in Emitter Coupled Logic (ECL) for bipolar technology or Source Coupled Logic (SCL) for MOS technology. These implementations require dc current biasing, 3 transistor stacks, and resistors or a $4^{th}$ transistor level for the load, all of which limit the size, supply voltage, and power consumption of these circuits. Implementation in CMOS logic, has been avoided because of the supply and ground noise generated during rail-to-rail transitions.

The PLL synthesizer in existing location receiver integrated circuits typically consumes 30% to 50% of the front-end power, and a larger portion of the integrated circuit area. Thus, the PLL synthesizer has a significant influence on the size, power consumption and silicon cost of the location receiver. One of the reasons for the high power requirements of the PLL synthesizer is the dc current required by the ECL or SCL technology used to implement the components of the PLL synthesizer.

Therefore, there is a need for methods and systems for implementing PLL synthesizer in an integrated circuit, such as used in location receivers that reduce the area in the integrated circuit required by the PLL synthesizer and a reduce the power requirements of the integrated circuit. This is increasingly important for hand-held and portable applications of GPS receivers.

SUMMARY

Systems consistent with the present invention provide an approach to implementing PLL synthesizers that have a fractional-N divider, integer divider and phase frequency detector in standard CMOS logic, which reduces the amount of chip area and power consumption compared with known approaches. The fractional-N divider and integer divider RF-frequency PLL synthesizer blocks along with the lower frequency phase frequency detector synthesizer block do not require dc bias current and have active power consumption and size that may scale with process technology.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Unlike the known approaches previously discussed, a location receiver with a low power radio-frequency (RF) phase-locked loop (PLL) synthesizer is described. The die or integrated circuit area and power requirements of the PLL synthesizer within the location receiver is also scalable with the fabrication process technology employed, while overcoming supply and ground noise issues inherent in rail-to-rail transitions of CMOS gates.

Figure 1:
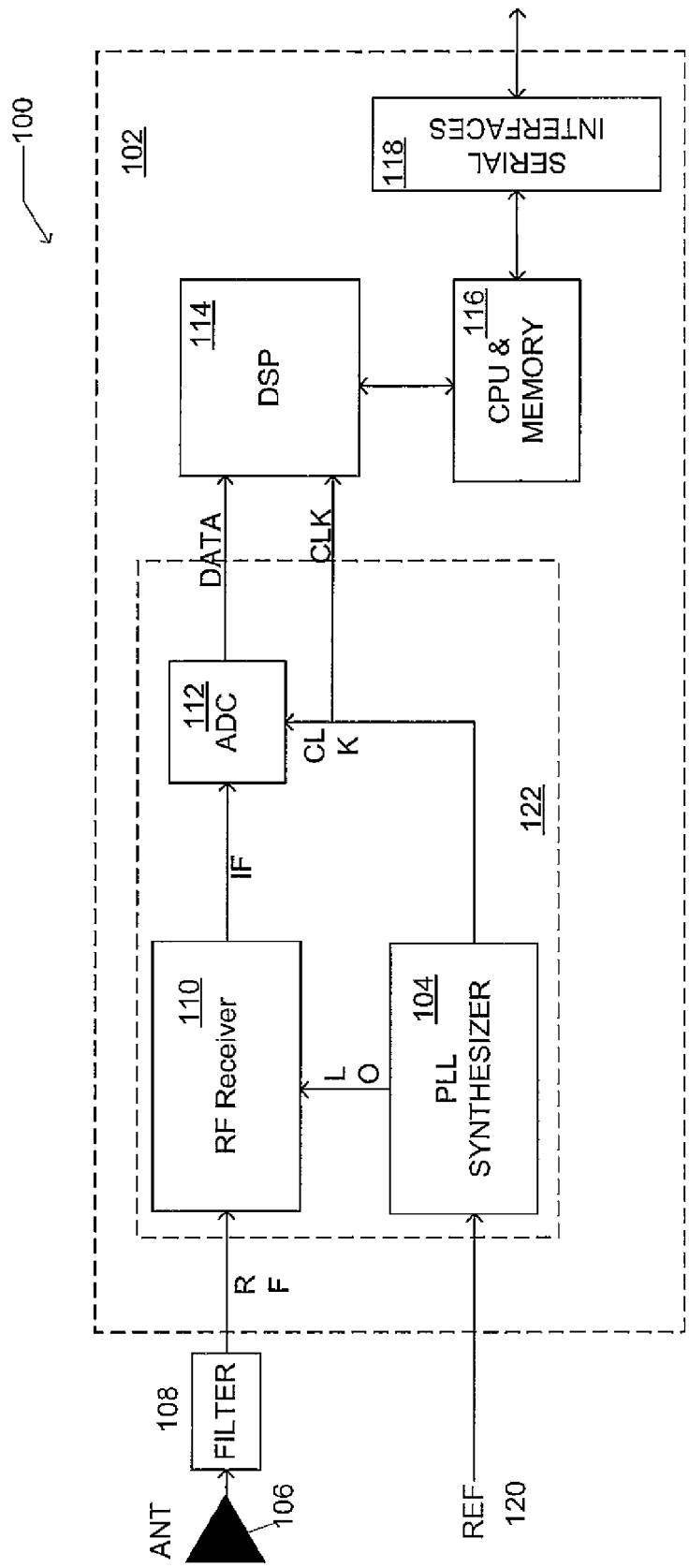
FIG. 1 is a block diagram of an exemplary implementation of a location receiver with a PLL synthesizer.

Turning to FIG. 1, a block diagram 100 of an exemplary implementation of a location receiver 102 with a RF PLL synthesizer 104 is illustrated. The location receiver 102 receives a location signal, such as a GPS signal from GPS satellites at an antenna 106. The location signal may be passed through filters 108 such that the desired RF signals arrive at the RF receiver 110. The RF signal may be processed by the RF receiver 110 and down converted to an intermediate frequency (IF) signal. The IF signal may then be converted by an analogue-to-digital converter (ADC) 112 from a summation of analogue waveforms into a bit-stream of digital data. The digital data from ADC 112 may then be processed by the digital signal processor (DSP) 114 where PN codes are identified and the location of the location receiver 102 may be determined.

The DSP 114 may be in communication with a central processing unit (CPU) and memory 116 with the CPU also being in communication with an input/output interface, such as serial interface 118. The serial interface 118 may be employed to output location information to another device or display. In other implementations, the DSP 114 and CPU and memory 116 may be the same device, such as a microprocessor or controller. The memory may also be part of the CPU or DSP or it may be external to the CPU and memory 116 and DSP 114. In yet other implementations, the computation of position may be done by an external host CPU, eliminating the need for the CPU and Memory 116, such as in a tracker implementation. In yet another implementation the receiver integrated circuit would only consist of the RF and Analog functions, 104, 110 and 112 with IF samples output, and the digital processing and position calculation would be done by software running on a PC or other general purpose microprocessor/controller, such as in a software GPS receiver.

A reference signal or clock 120 may also be provided to the location receiver 102 for use by a RF PLL synthesizer 104. The RF PLL synthesizer 104 is used to lock the receiver local oscillator (LO) frequency to an accurate reference signal frequency. This ensures that the IF frequency has a fixed relation to the GPS carrier frequency. The RF PLL synthesizer 104 may also supply a clock to the ADC 112 and DSP 114. The circuits in the location receiver 102 that do the analog processing and digitization of the location signal may be referred to as the front-end 122 of the location receiver 102.

Figure 2:
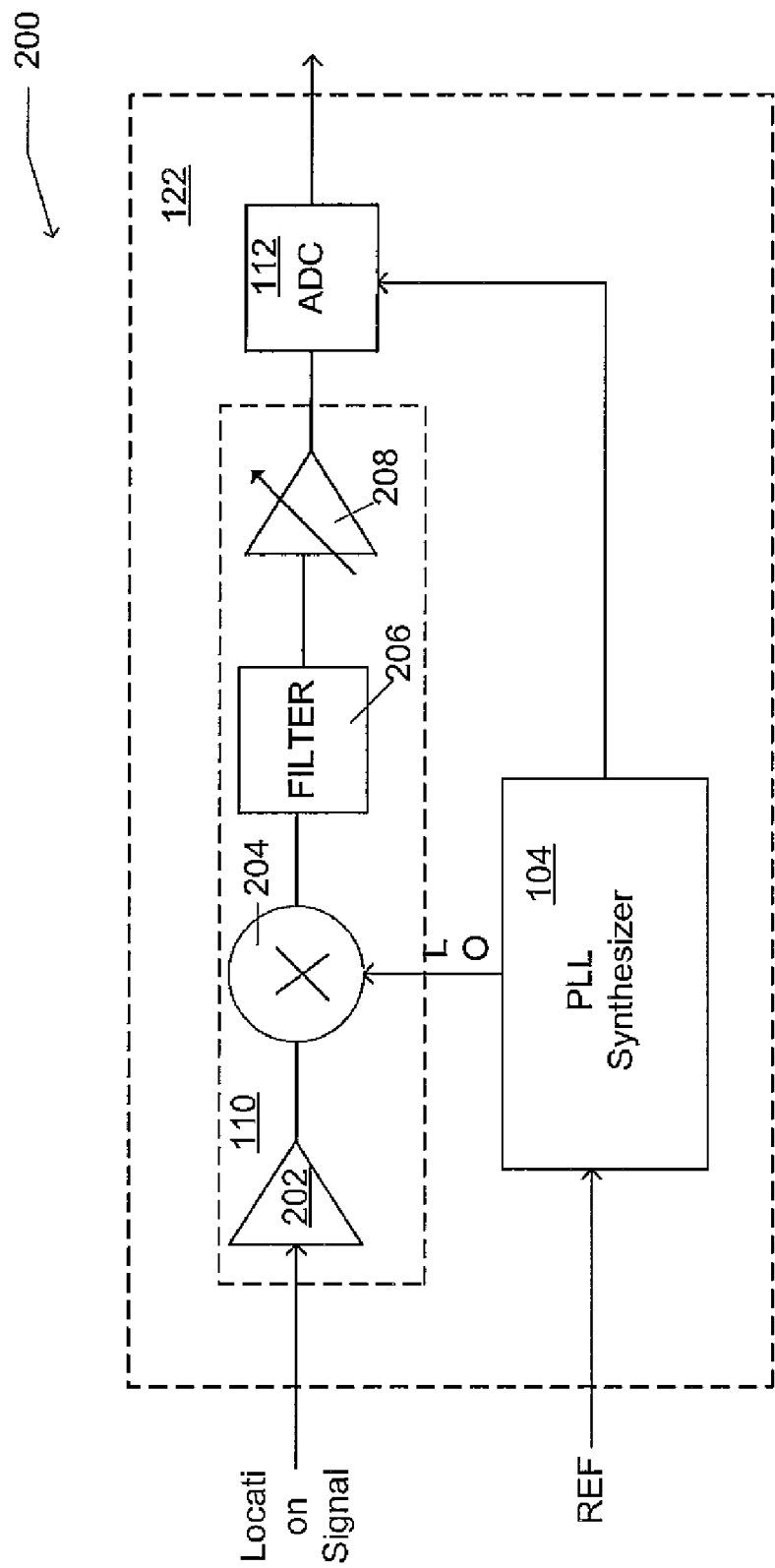
FIG. 2 is a block diagram of the front-end of the location receiver of FIG. 1.

In FIG. 2, a block diagram 200 of the front-end 122 of location receiver 102 in FIG. 1 is shown. The front-end 122 has a receiver 110, a ADC 112 and a RF PLL synthesizer 104. The RF receiver 110 may be created with subcomponents, such as an amplifier 202, mixer 204, filter 206, and automatic gain control (AGC) 208. The location signal is received at the amplifier 202 in the RF receiver 110. The location signal may then be mixed with a LO signal from the RF PLL synthesizer 104. The combined signal may then be filtered by a filter 206, such as a band pass filter. The filtered signal then passes through an AGC 208 that adjusts the signal for conversion from continuous wave forms to digital data by the ADC 112. The resulting digital data is IF signal samples. The RF PLL synthesizer 104 receives a reference signal that is typically external to the front-end 122. The received reference signal may then be used by the front-end to downconvert the desired received signal and to provide the clocking used by the ADC 112 for sampling.

The function of the PLL synthesizer is to synthesize frequency-accurate LO and clock signals required by the location receiver 102, at the required frequencies, from a known reference frequency. Since the signals generated by the PLL synthesizer are phase locked to the reference signal, the spectral quality of these signals will depend on the spectral quality of the reference and on the noise produced by the PLL synthesizer. A fractional-N PLL synthesizer enables the user to use any reference frequency within a specified frequency range.

Unlike the traditional PLL synthesizer, the divider and PFD blocks of RF PLL synthesizer 104 are not implemented in emitter coupled logic (ECL) or source coupled logic (SCL). Majority of the high-frequency PLL synthesizer circuitry 104 does not require dc current biasing and employs primarily digital CMOS circuits. The implementation of the PLL synthesizer components in digital CMOS is hampered by the supply and ground noise generated during rail-to-rail transitions of the CMOS gates. The supply and ground currents generated by these transitions scale with the supply voltage and the capacitance that needs to be charged and discharged. Both the capacitances and the supply voltage decrease for smaller process technologies. Thus, the effect of these transitions on the PLL phase noise will decrease as we progress to smaller CMOS process technologies. The transition noise which may have been prohibitive in a 0.5 um process becomes increasingly manageable for 0.18 um, 0.13 um and 90 nm processes, and a 1.6 GHz input clock which would have been impossible in 0.5 um CMOS is achievable in 0.18 um and smaller technologies. Therefore, advanced CMOS processes enable the inputs of the frequency dividers in the RF PLL synthesizer 104 to toggle at RF frequencies higher than 1.6 GHz.

Figure 3:
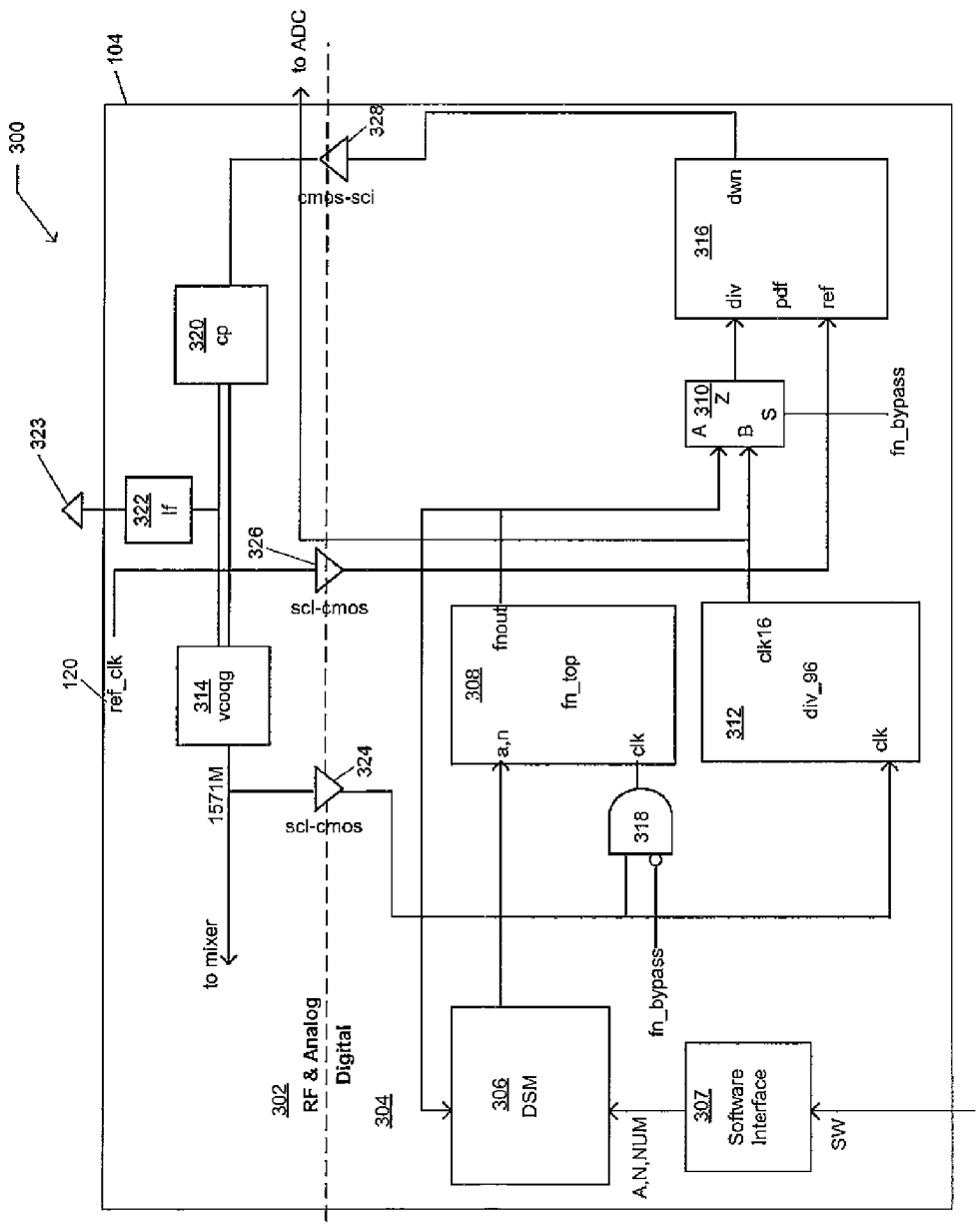
FIG. 3 is a block diagram of the PLL synthesizer of the front-end of FIG. 2 that show the digital and analog portions.

Turning to FIG. 3, a block diagram of the PLL synthesizer 104 in front-end 122 of FIG. 2 that depicts the digital and analog portions of the PLL synthesizer 104 is shown. The RF PLL synthesizer 104 may have a RF and analog portion 302 and a digital portion 304 of the device or integrated circuit. In the digital portion 304, software may reside in the DSP 114, CPU and memory 116, application specific controller (ASIC), or even be implemented with digital logic that functions as a state machine. The software may configure the delta sigma modulator (DSM) 306 via a serial interface 307 to set the divide ratio. The DSM 306 may receive a fractionally divided signal (fnout), to serve as its clock, from the fractional-N divider 308 output and provide a digital control signal to the fractional-N divider 308. The digital control signal may be the "divide ratio+dither" or "divider control." The digital control signal may be a digital word in memory that sets the instantaneous divide ratio of the fractional-N divider 308; for example the divide ratio can be changed from 83.9672 to 93.4588 by changing the word in memory. The fractional divider 308 also provides the fnout signal to the multiplexer 310. The multiplexer 310 may also receive a clk16 signal from the integer divider 312. The clk16 signal from the integer divider 312 may also be made available as a sampling clock for the ADC 112 of FIG. 2 that may reside in the RF and analog portion 302 of the front-end 122.

The integer divider 312 may be implemented as a divide by 96 integer divider that receives a clock signal that is approximately 1571 MHz from an oscillator or clock, such as a voltage controlled oscillator (VCO) 314 located in the RF and analog portion 302 of the front-end 122. In the current implementation, the clock signal is actually 1571.377 MHz. The output of the multiplexer 310 may be selected by the control signal "fn_bypass" and supplied to the phase frequency detector (PDF) 316. The fn_bypass is a control signal set by the SI block 307: if fn_bypass=1 the fractional divider is bypassed and only the integer divider is used; in this case the reference frequency has to be exactly equal to the VCO frequency divided by 96. The "fn_bypass" signal may be inverted and passed through an AND gate 318 along with the clock signal from the VCO 314 in order to gate off the clock signal for the fractional-N divider 308, when the fractional divider is bypassed.

The phase frequency detector 316 may receive the reference signal 120 or clock from an oscillator or clock that resides in the RF and analog portion 302 of the front-end 122. The output of the phase frequency detector 316 may be used by a charge pump 320 that has an output used by a passive loop filter (LF) 322 and used to adjust the VCO 314. The LF 322 is also connected to a ground 323. The loop filtered signal from the VCO 314 is then made available to the mixer of RF receiver 110 of FIG. 2.

The 1571 MHz (1.571 GHz) RF signal generator may be implemented as a VCO oscillating at 1571 MHz or as a VCO oscillating at a factor of 1571 MHz (such as 3142 MHz) that may be divided to generate the 1571 MHz signal. The 1571 MHz signal may be supplied directly to the mixer 204 of FIG. 2. The 1571 MHz signal may also be converted from source coupled logic (scl) to full-swing CMOS by scl-CMOS translators 324 and 326. After conversion, the 1571 signal is directed to the two frequency divider blocks (fractional-N divider 308 and integer divider 312). The fractional-N divider 308 may be a programmable fractional-N frequency divider that works in conjunction with the DSM 306, while the integer divider 312 may be a fixed integer divider, such as a divide by 96 integer divider shown in FIG. 3. The parameters of the programmable fractional-N frequency divider 308 and DSM 306 may be configurable via the serial interface 307 and receive divide ratio settings from software.

The RF PLL synthesizer 104 may be used in either the fractional-N mode or integer-N mode, with the mode being selected via the control signal fn_bypass. In either mode, the integer divider 312 may always be running, in order to supply the sampling clock for use by the ADC 112, of FIG. 2. But, in order to reduce power consumption the fractional-N divider 308 input clock may be disabled by AND gate 318 with the "fn_bypass" signal.

The output of the PFD 316 is coupled to the CP 320 by a CMOS-to-scl translator 328. But, in other implementations the CP 320 may be able to receive digital inputs directly and the CMOS-to-scl translator 328 would no longer be necessary. The passive LF 322 may be implemented within the RF PLL synthesizer 104 as shown in FIG. 3 or may be implemented separate from the RF PLL synthesizer 104.

Figure 4:
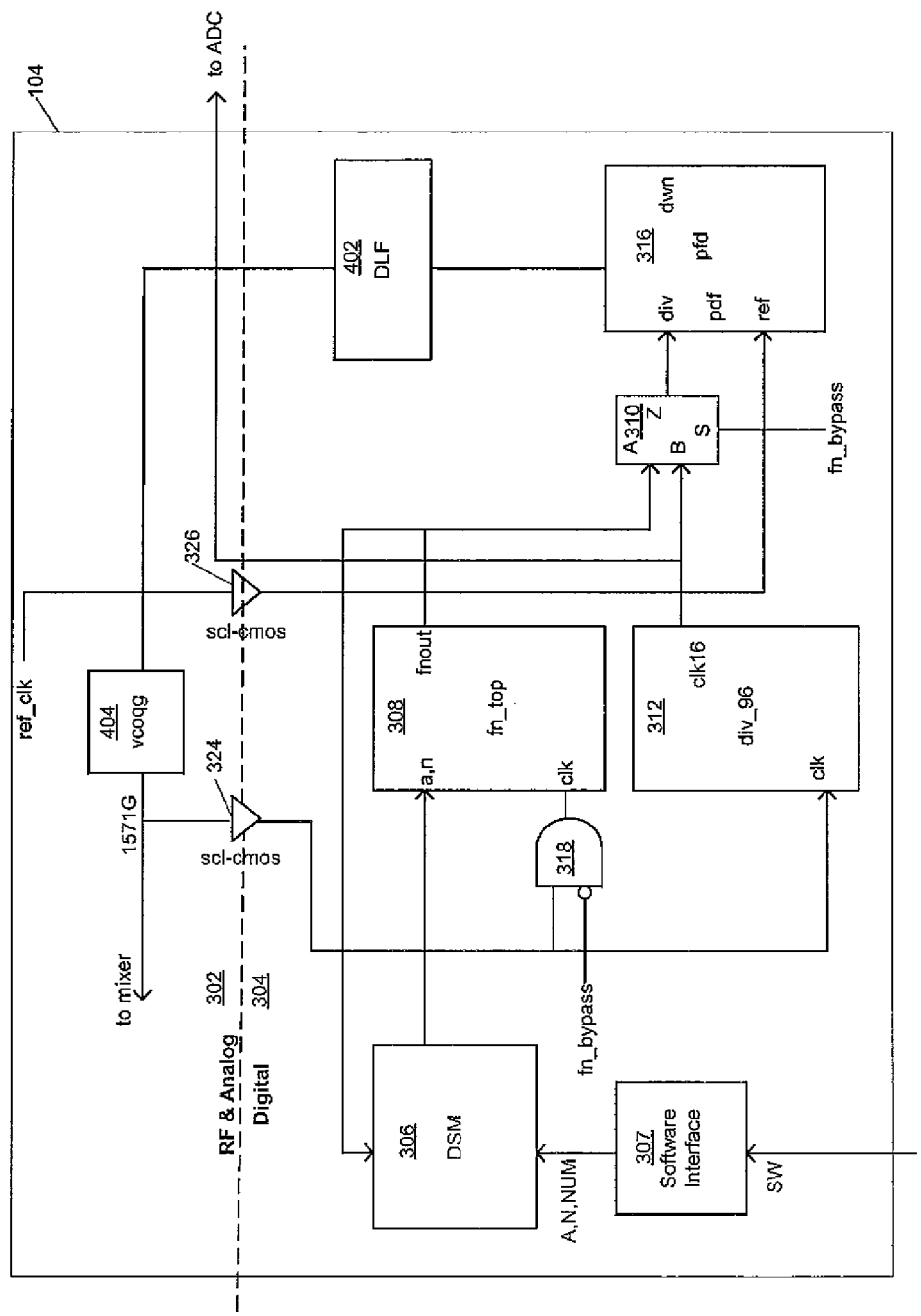
FIG. 4 is a block diagram of an exemplary implementation of the PLL synthesizer of FIG. 3 with a digital loop filter (DLF).

In FIG. 4, a block diagram 400 of exemplary implementation of the RF PLL synthesizer 104 of FIG. 3 with a digital loop filter (DLF) 402 is shown. The DLF 402 replaces the charge pump 320 and CMOS-scl translator 328 shown in FIG. 3. The VCO 404 in FIG. 4 is a digital controlled oscillator that receives a digital signal from the DLF 402. The additional digitization of the components in the RF PLL synthesizer 104 enables further power savings and reduction in required die space or area in an integrated circuit. The rest of the components of the RF PLL synthesizer 104 shown in block diagram of FIG. 4, operate in a similar manner to the components described in FIG. 3.

Figure 5:
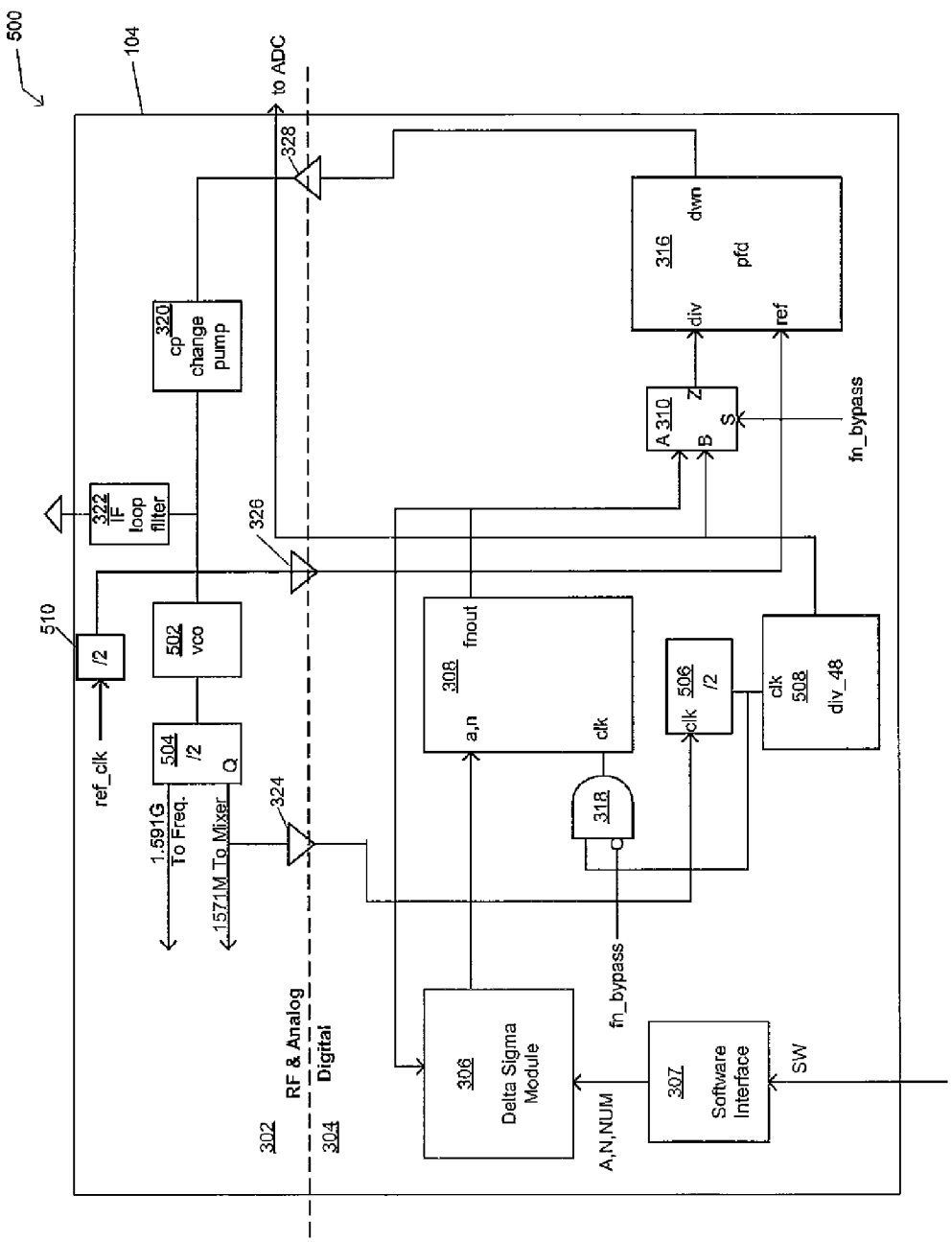
FIG. 5 is a block diagram of another exemplary implementation of the PLL synthesizer of the FIG. 3 with the voltage controlled oscillator oscillating at twice the frequency of the mixer.

Turning to FIG. 5, a block diagram 500 of another exemplary implementation of the PLL synthesizer 104 of FIG. 3 with a VCO 502 that oscillates at twice the LO frequency of the mixer 204 of FIG. 2 is shown. A master-slave flip-flop 504 divides the frequency of the signal generated by the VCO 502 by 2. The output of the master-slave flip-flop 504 may be available in the I and Q phases. The input frequency of the digital fractional divider 308 may be cut in half by a divide by 2 flip-flop 506. The divide by 2 flip-flop 506 may be followed by the integer divider 508, but the integer divider 508 is shown as a divide by 48 integer divider rather than the divide by 96 integer divider as shown in FIG. 3. The reference clock 120 supplied to the PFD 316 may also be divided by 2 via divider 510. By decreasing the input frequency of the fractional divider via 506, an increase in yield and reliability may be achieved with the slower clock input. Such decreases in clock speeds also reduces the supply and ground noise generated during operation of the RF PLL synthesizer 104.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A radio frequency (RF) phase locked loop (PLL) synthesizer, comprising:
    a variable oscillator (VCO) that generates a clock signal;
    a fractional-N divider that has an fractional-N divider output coupled to a delta sigma modulator and in receipt of the clock signal;
    an integer divider that has an integer divider output in receipt of the clock signal; and
    a phase frequency detector (PFD) in receipt of either the fractional-N divider output or the integer divider output that is selected with a bypass signal, where the fractional-N divider, integer divider and PFD are formed in a CMOS logic block.

2. The RF PLL synthesizer of claim 1, where the CMOS logic block further includes control logic for generating the bypass signal.

3. The RF PLL synthesizer of claim 1, further comprising a multiplexer in the CMOS logic block that selects between the output of the fractional-N divider and the other output of the integer divider.

4. The RF PLL synthesizer of claim 3, where the selection of the integer divider results in the clock signal being turned off to the Fractional-N divider.

5. The RF PLL synthesizer of claim 1, wherein the clock signal has a frequency of approximately 1571 MHz.

6. The PLL synthesizer of claim 1, where the integer divider is an integer divider that divides by 96.

7. The RF PLL synthesizer of claim 1, further includes a digital loop filter that receives an output from the phase frequency detector, where the digital loop filter is part of the CMOS logic block.

8. The RF PLL synthesizer of claim 1, where the VCO operates at twice the frequency required by a mixer.

9. The RF PLL synthesizer of claim 8, where a flip-flop divides a signal from the VCO by an integer.

10. The RF PLL synthesizer of claim 9, where the integer is two.

11. The RF PLL synthesizer of claim 8, wherein a signal from the flip-flop is divided by two prior to receipt by the fractional-N divider.

12. The RF PLL synthesizer of claim 1, where the integer divider is a programmable integer divider.

13. A method for radio frequency (RF) phase looked loop (PLL) synthesizing, comprising:
    generating a clock signal with a variable oscillator (VCO);
    dividing the clock signal with a fractional-N divider that has an fractional-N divider output coupled to a delta sigma modulator and in receipt of the clock signal;
    dividing the clock signal with an integer divider that has an integer divider output in receipt of the clock signal; and
    selecting either the fractional-N divider output or the integer divider output with a bypass signal to be processed by a phase frequency detector (PFD), where the selecting occurs in a CMOS logic block.

14. The method for RF PLL synthesizing of claim 13, where the generating of the bypass signal occurs in the CMOS logic block.

15. The method for RF PLL synthesizing of claim 13, further comprising selecting with a multiplexer in the CMOS logic block between the output of the fractional-N divider and the other output of the integer divider.

16. The method for RF PLL synthesizing of claim 15, where selecting the integer divider further includes turning off the clock signal to the Fractional-N divider.

17. The method for RF PLL synthesizing of claim 13, wherein the clock signal has a frequency of approximately 1571 MHz.

18. The method for RF PLL synthesizing of claim 13, where the dividing by the integer divider is by 96.

19. The method for RF PLL synthesizing of claim 13 further includes, filtering with a digital loop filter that receives an output from the phase frequency detector, where the digital loop filter is part of the CMOS logic block.

20. The method for RF PLL synthesizing of claim 13 includes, operating the VCO at a frequency two times the frequency required by a mixer.

21. The method for RF PLL synthesizing of claim 20 further includes, dividing a signal from the VCO by an integer with a flip-flop.

22. The method for RF PLL synthesizing of claim 21, where dividing by an integer is dividing by two.

23. The method for RF PLL synthesizing of claim 20, includes dividing a signal from the flip-flop by two prior to receipt by the fractional-N divider.

24. The method for RF PLL synthesizing of claim 13, programming the integer divider coupled to the reference frequency, where the integer divider is a programmable integer divider.

* * * * *